(12) United States Patent
Rajeswaran et al.

(10) Patent No.: US 7,169,484 B2
(45) Date of Patent: Jan. 30, 2007

(54) PROCESS FOR FORMING A COMPOSITE INCLUDING AN ALUMINUM TRISQUINOLINE COMPLEX

(75) Inventors: Manju Rajeswaran, Fairport, NY (US); Thomas N. Blanton, Rochester, NY (US); Ching W. Tang, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 291 days.

(21) Appl. No.: 10/834,621

(22) Filed: Apr. 29, 2004

(65) Prior Publication Data

US 2005/0244671 A1 Nov. 3, 2005

(51) Int. Cl.
*H01L 51/50* (2006.01)
*H05B 33/14* (2006.01)

(52) U.S. Cl. ............... 428/690; 428/917; 313/504; 313/506; 427/66; 427/157

(58) Field of Classification Search ............... 428/690, 428/917; 313/504, 506; 427/66, 157
See application file for complete search history.

(56) References Cited

U.S. PATENT DOCUMENTS

2003/0134146 A1* 7/2003 Aziz et al. ............... 428/690
2005/0248263 A1* 11/2005 Muccini et al. ............ 313/504

FOREIGN PATENT DOCUMENTS

| JP | 4-85388 | 3/1992 |
|----|---------|--------|
| JP | 4-206296 | 7/1992 |
| WO | 03/106422 | 12/2003 |

OTHER PUBLICATIONS

Journal of Applied Physics, vol. 90, No. 12, Dec. 15, 2001, p. 6092-6097.*
Materials Science and Engineering B100 (2003), p. 40-46.*
NATO Science Series, II: Mathematics, Physics, and Chemistry (2003), 116(Metal-Ligand Interactions), p. 321-341.*
Faguang Xuebao (2003), 24(1), p. 44-49.*
Chemical Communications, (2002), pp. 2908-2909.*
Journal of Physical Chemistry A (2003), 107, p. 2560-2569.*
Phys. Chem. Chem. Phys. (2003), vol. 5, pp. 2958-2963.*
Journal of Applied Physics, vol. 96, No. 11, Dec. 1, 2004, pp. 6133-6141.*
Chemical Physics Letter 294 (Sep. 18, 1998), pp. 263-271.*
Journal of Chemical Physics, vol. 114, No. 21, Jun. 1, 2001, pp. 9625-9632.*

(Continued)

*Primary Examiner*—Dawn Garrett
(74) *Attorney, Agent, or Firm*—Arthur E. Kluegel

(57) ABSTRACT

A process for forming a film of the facial-isomer of an aluminum trisquinoline complex comprises depositing a film of an aluminum trisquinoline complex on a support, depositing an inert barrier layer over the layer of aluminum trisquinoline complex that encapsulates aluminum trisquinoline complex to form a multilayer composite, and then heating the composite at a temperature below the melting point temperature of the complex for a time sufficient to convert the aluminum trisquinoline complex to at least 99 mol % of the facial-isomer that fluoresces with a maximum emission intensity below 510 nm. The product has a blue hue.

34 Claims, 1 Drawing Sheet

OTHER PUBLICATIONS

Chemical Physics Letters, vol. 358 (Jun. 24, 2002), pp. 144-150.*

Brinkmann, M., et al., "Correlation Between Molecular Packing and Optical Properties in Different Crystalline Polymorphs and Amorphous Thin Films of *mer*-Tris(8-hydroxyquinoline)aluminum(III)", J. Am. Chem. Soc., 2000, pp. 5147-5157.

Cölle, M., et al., "Preparation and Characterization of Blue-Luminescent Tris(8-hydroxyquinoline)aluminum ($Alq_3$)", Advanced Functional Materials, 2003, pp. 108-112.

Rajeswaran, M., et al., "Refinement of the Crystal Structure of the δ-modification of tris(8-hydroxyquinoline)aluminum(III), δ-Al($C_9H_6NO)_3$, *the blue luminescent $Alq_3$*", Z Kristallogr. NCS 218 (2003), pp. 1-2.

Blanton, T. N., et al., "Process for Preparing Aluminum Trisquinoline Complex", U.S. Appl. No. 10/834,827, (D-87151) filed Apr. 29, 2004.

* cited by examiner

PROCESS FOR FORMING A COMPOSITE INCLUDING AN ALUMINUM TRISQUINOLINE COMPLEX

FIELD OF THE INVENTION

This invention relates to a process for forming a composite that includes an aluminum trisquinoline complex that emits blue light and the use of this composite in an electroluminescent device.

BACKGROUND OF THE INVENTION

While organic electroluminescent (EL) devices have been known for over two decades, their performance limitations have represented a barrier to many desirable applications. In simplest form, an organic EL device is comprised of an anode for hole injection, a cathode for electron injection, and an organic medium sandwiched between these electrodes to support charge recombination that yields emission of light. These devices are also commonly referred to as organic light-emitting diodes, or OLEDs. Representative of earlier organic EL devices are Gurnee et al. U.S. Pat. No. 3,172,862, issued Mar. 9, 1965; Gurnee U.S. Pat. No. 3,173,050, issued Mar. 9, 1965; Dresner, "Double Injection Electroluminescence in Anthracene", RCA Review, 30, 322–334, (1969); and Dresner U.S. Pat. No. 3,710,167, issued Jan. 9, 1973. The organic layers in these devices, usually composed of a polycyclic aromatic hydrocarbon, were very thick (much greater than 1 µm). Consequently, operating voltages were very high, often greater than 100V.

More recent organic EL devices include an organic EL element consisting of extremely thin layers (e.g., less than 1.0 µm) between the anode and the cathode. Herein, the term "organic EL element" encompasses the layers between the anode and cathode. Reducing the thickness lowered the resistance of the organic layer and has enabled devices that operate at much lower voltage. In a basic two-layer EL device structure, described first in U.S. Pat. No. 4,356,429, one organic layer of the EL element adjacent to the anode is specifically chosen to transport holes, and therefore, it is referred to as the hole-transporting layer, and the other organic layer is specifically chosen to transport electrons, and is referred to as the electron-transporting layer. Recombination of the injected holes and electrons within the organic EL element results in efficient electroluminescence.

There have also been proposed three-layer organic EL devices that contain an organic light-emitting layer (LEL) between the hole-transporting layer and electron-transporting layer, such as that disclosed by Tang et al (J. Applied Physics, 65, Pages 3610–3616, (1989)). The light-emitting layer commonly consists of a host material doped with a guest material, also known as a dopant. Still further, there has been proposed in U.S. Pat. No. 4,769,292 a four-layer EL element comprising a hole-injecting layer (HIL), a hole-transporting layer (HTL), a light-emitting layer (LEL) and an electron transport/injection layer (ETL). These structures have resulted in improved device efficiency.

Since these early inventions, further improvements in device materials have resulted in improved performance in attributes such as color, stability, luminance efficiency and manufacturability, e.g., as disclosed in U.S. Pat. Nos. 5,061,569, 5,409,783, 5,554,450, 5,593,788, 5,683,823, 5,928,802, 6,020,078, and 6,208,077, amongst others.

Notwithstanding these developments, there are continuing needs for organic EL device components, such as new light-emitting materials, and methods for incorporating them into an EL device.

Tris(2-methyl-8-quinolinolato)aluminum(III), $Alq_3$, has been used extensively in electroluminescent devices because of its ability to transport electrons. It has been used as a yellow-green emissive material as well as a host for emissive dopants. Tris-chelated octahedral complexes, such as $Alq_3$, can exist in the meridional (A) or facial (B) isomeric forms. FIG. 1 show a simple picture of these two forms. The meridional-isomer of $Alq_3$ commonly crystallizes in either of two polymorphs often called the $\beta$ or $\epsilon$-phases. These forms will be referred to as $\beta$- and $\epsilon$-$Alq_3$.

Until very recently, only the meridional form of $Alq_3$ had been fully characterized, although, M. Yasushi, S. Kenji, U. Taeko (JP 2902745) and S. Kenji, K. Yasushi, U. Taeko, M. Yasushi, (JP 2823352) had reported a green emitting $Alq_3$ structure that they proposed as a facial-isomer.

Only recently the facial-isomer of $\delta$-$Alq_3$ has been identified and completely characterized and this form of $Alq_3$ emits blue light. Two phases ($\delta$ and $\gamma$) of $Alq_3$ that can be formed at higher temperatures have been characterized using X-ray diffraction technique as the primary characterization method. ["Refinement of the Crystal Structure of the $\delta$-Modification of tris(8-hydroxyquinoline) Aluminum(III), —$Al(C_9H_6NO)_3$, the blue luminescent $Alq_3$: Manju Rajeswaran, Thomas N. Blanton and Kevin P. Klubek, Z. Kristallogr. NCS 218, 439–440, 2003.] Recently M. Colle, J. Gmeiner, W. Milius, H. Hillebrecht, and W. Brutting, Adv. Funct. Mater., 13, 108 (2003) have also reported the $\delta$ form of $Alq_3$. Colle and co-workers report that for annealing temperatures up to 365° C., samples of $\alpha$-$Alq_3$ are a yellowish-green powder with a photoluminescence maximum of 506 nm. After an exothermic transition at about 380° C. they report the formation of the blue-light emitting $Alq_3$.

The facial-isomer of $\delta$-$Alq_3$ is very interesting due to its blue emission since it is known that other colors, such as green and red emission can be obtained from blue emitting materials by means of energy transfer to the appropriate dopant. However it has been very difficult to produce $Alq_3$ in the facial form in large quantities and in a pure form. Purity is important since, in certain cases, when the facial-isomer of $Alq_3$ is mixed with the meridional-isomer in a continuous film, energy transfer can occur from the blue emitting form to the green emitting phase resulting in a less desirable green emission by the mixture. It would also be desirable to have a process for producing only one polymorph of the facial-isomer of $Alq_3$ since it is known that polymorphs can have different physical properties and this can lead to problems in manufacturing a product.

It is not possible to deposit films of the blue-emitting facial-isomer of $Alq_3$ via common vapor deposition methods because heating the facial-isomer, such as the $\delta$-$Alq_3$, converts this material back into the $\alpha$-$Alq_3$ phase. Colle and co-workers do report evaporating thin films of $\alpha$-phase $Alq_3$ and then converting this material to the $\delta$-phase by annealing the film at 390° C. between two glass plates. This is not a practical procedure for preparing an EL device since glass does not form a conforming layer on the $Alq_3$ and large variations in layer thickness of the deposited $\delta$-phase layer would be anticipated.

Recently M. Muccini and co-workers (WO 2003/106422) also described a process for the preparation of the facial-isomer of $Alq_3$ as a mixture of two polymorphs, the $\gamma$ and $\delta$-phases of $Alq_3$, by heating the crystalline $\alpha$-phase to very high temperatures. They report that, starting from the α-phase of Alq$_3$, the solid state transformation of meridional-isomer into facial-isomer occurs only near 390° C. They describe heating commercial α-Alq$_3$ to 395° C. to form a mixture of γ and δ-Alq$_3$ wherein the ratio of γ-phase to the δ-phase is about 10/1 and that this ratio is not significantly changed by differences in heating and cooling rates or by heating at a temperature of 410° C. instead of 395° C.

Solution coatings of a mixture of the γ- and δ-phases of Alq$_3$ are also reported M. Muccini et al. to form films, deposited on quartz substrates, that emit blue light. Solutions of the facial-isomer of Alq$_3$ are kept at low temperature to prevent-isomerization to the meridional-isomer. However, the solution processing described is not readily applied to the solid-state deposition used in the formation of many EL devices.

It is a problem to be solved to provide an economical process for forming thin films of the facial form of an aluminum trisquinoline complex, such as δ-Alq$_3$, that would not require extremely high temperatures and that would provide films of high purity and integrity that emit blue light. In addition, it is desirable to find a means to provide composites comprising such films so that the composites dimensions are thermally stable and of uniform composition. Such composites would be suitable for use in an EL device, especially an OLED device which is formed by vapor-phase deposition.

SUMMARY OF THE INVENTION

The invention provides a process for forming a film of the facial-isomer of an aluminum trisquinoline complex comprises depositing a film of an aluminum trisquinoline complex on a support, depositing an inert barrier layer over the layer of aluminum trisquinoline complex that encapsulates aluminum trisquinoline complex to form a multilayer composite, and then heating the composite at a temperature below the melting point temperature of the complex for a time sufficient to convert the aluminum trisquinoline complex to at least 99 mol % of the facial-isomer that fluoresces with a maximum emission intensity below 510 nm. The invention also provides the multilayer composite formed by the process and devices and displays containing the composite.

DETAILED DESCRIPTION OF THE INVENTION

Figure 1:
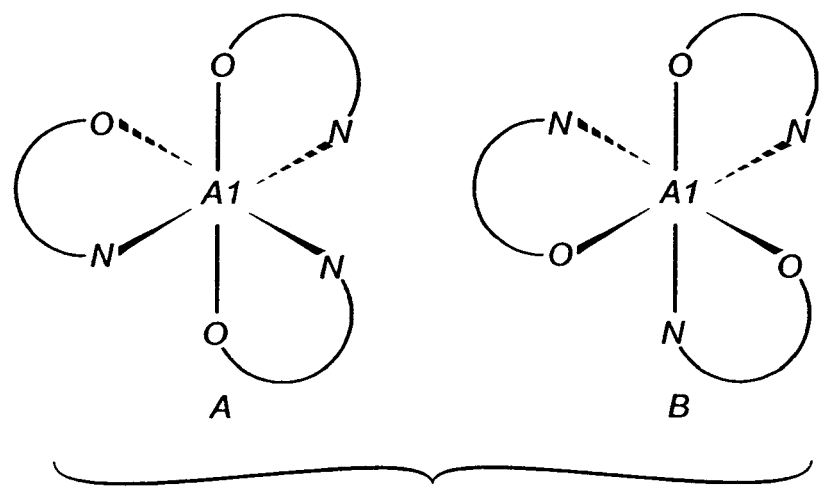
FIG. 1 shows a representation of the meridional and facial isomers of Alq$_3$.

As described in the summary, a process for forming a uniform film of the facial-isomer of an aluminum trisquinoline complex comprises depositing a film of an aluminum trisquinoline complex on a support and depositing an inert barrier layer over the layer of aluminum trisquinoline complex that encapsulates aluminum trisquinoline complex to form a multilayer composite. The support and barrier layers desirably comprise inert materials, that is materials that do not react during the process, for example the layers should not undergo a chemical reaction, such as decomposition, and they should not melt on heating at temperatures used during the process. Examples of suitable materials for the support and barrier layers are inorganic materials such as glass, metal, for example, silver or aluminum, or an organic material. In the case of a support comprising an organic material it is desirable that the glass transition temperature of the material is greater than the heating temperature of the process.

The complex is deposited on the support. Suitably it is deposited through sublimation or evaporation, but can be deposited by other means such as coating from a solvent together with an optional binder to improve film formation. In one desirable embodiment the complex is deposited on the support by vapor-phase deposition process.

The barrier layer comprises a material that can also be deposited onto the aluminum trisquinoline layer and that will encapsulate the aluminum trisquinoline layer. For example, the barrier layer may comprise a metal, such as aluminum or silver that can be deposited by various methods, for example a sputtering process. The barrier layer may include an organic material that is deposited by vapor-phase deposition methods, such as high-vacuum sublimation, but can be deposited by other means such as coating from a solvent, followed by evaporation of the solvent.

It is important that the barrier layer completely enclose or encapsulate the aluminum trisquinoline layer that has been deposited on the support layer, otherwise, during the heating step of the process, the aluminum trisquinoline layer may degrade due to sublimation of the complex. Simply placing a glass cover over the aluminum trisquinoline layer is insufficient to maintain the integrity of the layer during thermal processing.

The support layer is not required to be a material that can be deposited. However, in one desirable embodiment, the support layer is in turn composed of at least two layers. In one embodiment at least one of these additional layers comprises an organic material that may be deposited by vapor-phase deposition methods.

The support and barrier layers may comprise a cathode or an anode. In the case where the support or the barrier layer includes an anode, the anode may have additional layers present, such as a layer of hole-injecting material, a layer of hole-transporting material or both these layers. In the case where the support or the barrier layer includes a cathode, additional layers may also be present, for example a layer of electron-transporting material.

After the composite is formed, it is heated at a temperature below the melting point temperature of the complex for a time sufficient to convert the aluminum trisquinoline complex to at least 99 mol % of the facial-isomer, which will be referred to as the pure facial-isomer. Suitably, the aluminum trisquinoline complex is converted to at least 99.5 mol % and desirably to at least 99.9 mol % of the facial-isomer. Thus the meridional-isomer would be present at less than 1 mol %. Desirably the heating temperature is at least 50° C., 60° C. or even 70° C. or more below the melting point temperature. Suitably, the heating temperature is not more than 150° C. below the melting point, because in this case it may take too much time to effect the conversion to the facial-isomer.

The melting point temperature is the temperature at which the solid phase of the aluminum trisquinoline complex converts to the liquid phase. Some aluminum trisquinoline complexes may decompose before they melt. In this case, the melting point temperature refers to the temperature at which a substantial amount of the complex decomposes, for example, the temperature at which 10% or more of the complex decomposes. That is, the temperature at which 10% or more of the material is no longer an aluminum trisquinoline complex.

Suitably the facial-isomer formed in the composite after processing fluoresces with a maximum intensity in the blue or blue-green region of the spectrum. That is, when exposed to UV-light the facial-isomer emits light that is predominantly blue or blue-green in color. Blue light is generally defined as having a wavelength range in the visible region of the electromagnetic spectrum of 450–480 nm, blue-green light being in the range of 480–510 nm, and green 510–550 nm, as defined by Dr. R. W. G. Hunt in *The Reproduction of Colour in Photography, Printing & Television*, 4$^{th}$ Edition 1987, Fountain Press, page 4. For the purposes of this disclosure, visible light below 510 nm will be referred to as blue light. In one suitable embodiment the facial-isomer formed fluoresces with a maximum intensity below 510 nm and desirably below 500 nm.

The time required for heating can be determined by monitoring the process. For example by using UV-vis spectroscopy to determine the color of light that the complex emits upon excitation. Emission of blue light instead of yellow-green light indicates conversion of the meridional-isomer to the pure facial isomer. X-ray powder diffraction (XRPD) is also a useful monitoring technique that can be used to determine the extent of the conversion of the aluminum trisquinoline complex to the facial-isomer. Typically, heating time will be in the range of 0.01 to 48 h and commonly 0.05 h to 24 h, and often 0.1 to 1 hr.

In one desirable embodiment the composite is included in an EL device. Suitably the light-emitting layer of an EL device may comprise the composite. The composite may contain additional materials. For example the aluminum trisquinoline complex may be co-deposited with a light-emitting material, such as a dopant. In one embodiment, the dopant is present at a level of 0.1 to 10% by volume of the light-emitting layer.

In one embodiment the aluminum trisquinoline complex is represented by Formula (1).

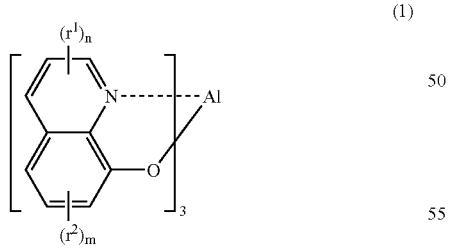

(1)

In Formula (1) the three quinoline groups may be the same or different. Each $r^1$ and $r^2$ represents an independently selected substituent. Examples of substituents are alkyl groups, such as a methyl group or aryl groups, such as a phenyl group or a tolyl group. Each n and m are independently 0–3. Each n and m are independently 0–3. In one embodiment, the quinoline groups of Formula (1) do not have an $r^1$ substituent α to the N atom. Illustrative compounds of Formula (1) are listed below.

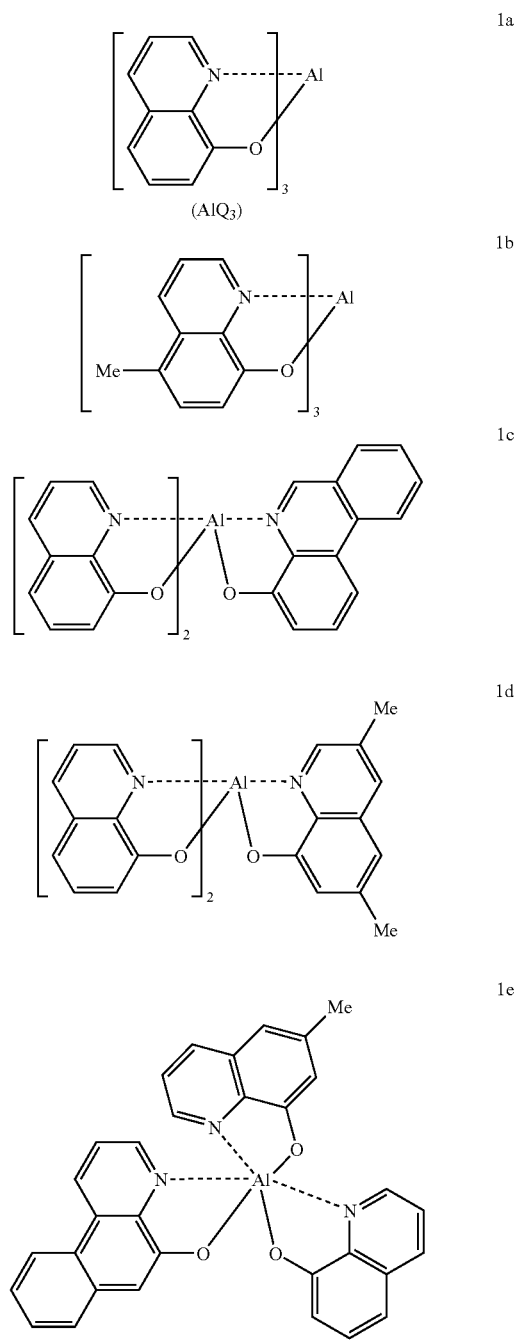

In one desirable embodiment each $r^1$ and $r^2$ represents hydrogen and the aluminum trisquinoline complex comprises tris(2-methyl-8-quinolinolato)aluminum(III), Alq$_3$. Based on data from differential scanning calorimetry (DSC) the temperature to form the δ-phase of Alq$_3$ has been determined to be about 390° C. The melting point temperature of Alq$_3$ has been determined to be 417° C. In one desirable embodiment, the process includes heating the multilayer composite that includes Alq$_3$ at or below a temperature of 370° C. for a sufficient time to convert the Alq$_3$ to at least 99 mol % the δ-phase of the facile-isomer of Alq$_3$.

Suitably, the process is carried out at a temperature below 360° C. or even below 350° C.

Unless otherwise specifically stated, use of the term "substituted" or "substituent" means any group or atom other than hydrogen. Additionally, when the term "group" is used, it means that when a substituent group contains a substitutable hydrogen, it is also intended to encompass not only the substituent's unsubstituted form, but also its form further substituted with any substituent group or groups as herein mentioned, so long as the substituent does not destroy properties necessary for device utility. Suitably, a substituent group may be halogen or may be bonded to the remainder of the molecule by an atom of carbon, silicon, oxygen, nitrogen, phosphorous, sulfur, selenium, or boron. The substituent may be, for example, halogen, such as chloro, bromo or fluoro; nitro; hydroxyl; cyano; carboxyl; or groups which may be further substituted, such as alkyl, including straight or branched chain or cyclic alkyl, such as methyl, trifluoromethyl, ethyl, t-butyl, 3-(2,4-di-t-pentylphenoxy)propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy)ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2,4-di-t-pentylphenoxy)butyramido, alpha-(3-pentadecylphenoxy)-hexanamido, alpha-(4-hydroxy-3-t-butylphenoxy)-tetradecanamido, 2-oxo-pyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl)carbonylamino, p-dodecylphenylcarbonylamino, p-tolylcarbonylamino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl)ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecylbenzenesulfonamido, N-methyltetradecylsulfonamido, N,N-dipropyl-sulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy) acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; imino, such as 1 (N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3 to 7 membered heterocyclic ring composed of carbon atoms and at least one hetero atom selected from the group consisting of oxygen, nitrogen, sulfur, phosphorous, or boron such as 2-furyl, 2-thienyl, 2-benzimidazolyloxy or 2-benzothiazolyl; quaternary ammonium, such as triethylammonium; quaternary phosphonium, such as triphenylphosphonium; and silyloxy, such as trimethylsilyloxy.

If desired, the substituents may themselves be further substituted one or more times with the described substituent groups. The particular substituents used may be selected by those skilled in the art to attain the desired desirable properties for a specific application and can include, for example, electron-withdrawing groups, electron-donating groups, and steric groups. When a molecule may have two or more substituents, the substituents may be joined together to form a ring such as a fused ring unless otherwise provided. Generally, the above groups and substituents thereof may include those having up to 48 carbon atoms, typically 1 to 36 carbon atoms and usually less than 24 carbon atoms, but greater numbers are possible depending on the particular substituents selected.

General Device Architecture

In one embodiment, the present invention may be employed in an EL device. Many EL device configurations are known including using small molecule materials, oligomeric materials, polymeric materials, or combinations thereof. These include very simple structures comprising a single anode and cathode to more complex devices, such as passive matrix displays comprised of orthogonal arrays of anodes and cathodes to form pixels, and active-matrix displays where each pixel is controlled independently, for example, with thin film transistors (TFTs). In one desirable embodiment the composite of the invention is included in an EL device configuration using small molecule materials.

There are numerous configurations of the organic layers wherein the present invention can be successfully practiced. The essential requirements of an OLED are an anode, a cathode, and an organic light-emitting layer located between the anode and cathode. Additional layers may be employed as more fully described hereafter.

Figure 2:
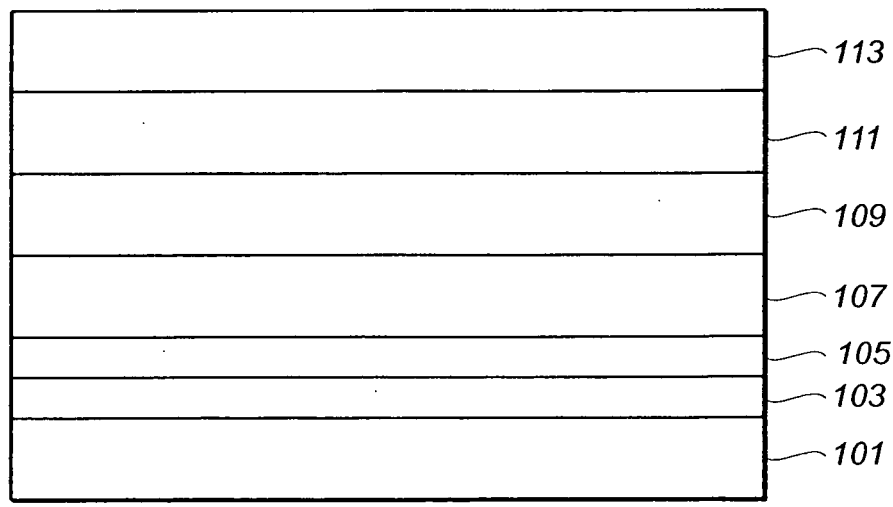
FIG. 2 shows a schematic cross-section of a typical OLED device.

A typical structure according to the present invention and especially useful for a small molecule device, is shown in FIG. 2 and is comprised of a substrate 101, an anode 103, a hole-injecting layer 105, a hole-transporting layer 107, a light-emitting layer 109, an electron-transporting layer 111, and a cathode 113. These layers are described in detail below. Note that the substrate 101 may alternatively be located adjacent to the cathode 113, or the substrate 101 may actually constitute the anode 103 or cathode 113. The organic layers between the anode 103 and cathode 113 are conveniently referred to as the organic EL element. Also, the total combined thickness of the organic layers is desirably less than 500 nm. If the device includes phosphorescent material, a hole-blocking layer, located between the light-emitting layer and the electron-transporting layer, may be present.

The anode 103 and cathode 113 of the OLED are connected to a voltage/current source through electrical conductors. The OLED is operated by applying a potential between the anode 103 and cathode 113 such that the anode 103 is at a more positive potential than the cathode 113. Holes are injected into the organic EL element from the anode 103 and electrons are injected into the organic EL element at the cathode 113. Enhanced device stability can sometimes be achieved when the OLED is operated in an AC mode where, for some time period in the AC cycle, the potential bias is reversed and no current flows. An example of an AC driven OLED is described in U.S. Pat. No. 5,552,678.

Substrate

In one embodiment of this invention an OLED device is provided over a supporting substrate 101 where either the cathode 113 or anode 103 can be in contact with the substrate. The electrode in contact with the substrate 101 is conveniently referred to as the bottom electrode. Conventionally, the bottom electrode is the anode 103, but this invention is not limited to that configuration. The substrate 101 can either be light transmissive or opaque, depending on the intended direction of light emission. The light transmissive property is desirable for viewing the EL emission through the substrate 101. Transparent glass or plastic is commonly employed in such cases. The substrate 101 can be a complex structure comprising multiple layers of materials. This is typically the case for active matrix substrates wherein TFTs are provided below the OLED layers. It is still necessary that the substrate 101, at least in the emissive pixelated areas, be comprised of largely transparent materials such as glass or polymers. For applications where the EL emission is viewed through the top electrode, the transmissive characteristic of the bottom support is immaterial, and therefore the substrate can be light transmissive, light absorbing or light reflective. Substrates for use in this case include, but are not limited to, glass, plastic, semiconductor materials such as silicon, ceramics, and circuit board materials. Again, the substrate 101 can be a complex structure comprising multiple layers of materials such as found in active matrix TFT designs. It is necessary to provide in these device configurations a light-transparent top electrode.

Anode

When the desired electroluminescent light emission (EL) is viewed through the anode, the anode 103 should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode 103. For applications where EL emission is viewed only through the cathode 113, the transmissive characteristics of the anode 103 are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes. Optionally, anodes may be polished prior to application of other layers to reduce surface roughness so as to minimize short circuits or enhance reflectivity.

Cathode

When light emission is viewed solely through the anode 103, the cathode 113 used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One useful cathode material is comprised of a Mg:Ag alloy wherein the percentage of silver is in the range of 1 to 20%, as described in U.S. Pat. No. 4,885,221. Another suitable class of cathode materials includes bilayers comprising the cathode and a thin electron-injection layer (EIL) in contact with an organic layer (e.g., an electron transporting layer (ETL)), the cathode being capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. An ETL material doped with an alkali metal, for example, Li-doped Alq, is another example of a useful EIL. Other useful cathode material sets include, but are not limited to, those disclosed in U.S. Pat. Nos. 5,059,861, 5,059,862, and 6,140,763.

When light emission is viewed through the cathode, the cathode 113 must be transparent or nearly transparent. For such applications, metals must be thin or one must use transparent conductive oxides, or a combination of these materials. Optically transparent cathodes have been described in more detail in U.S. Pat. Nos. 4,885,211, 5,247,190, 3,234,963, 5,703,436, 5,608,287, 5,837,391, 5,677,572, 5,776,622, 5,776,623, 5,714,838, 5,969,474, 5,739,545, 5,981,306, 6,137,223, 6,140,763, 6,172,459, EP 1 076 368, 6,278,236, and 6,284,3936. Cathode materials are typically deposited by any suitable method such as evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Hole-Injecting Layer (HIL)

A hole-injecting layer 105 may be provided between anode 103 and hole-transporting layer 107. The hole-injecting layer can serve to improve the film formation property of subsequent organic layers and to facilitate injection of holes into the hole-transporting layer 107. Suitable materials for use in the hole-injecting layer 105 include, but are not limited to, porphyrinic compounds as described in U.S. Pat. No. 4,720,432, plasma-deposited fluorocarbon polymers as described in U.S. Pat. No. 6,208,075, and some aromatic amines, for example, MTDATA (4,4',4"-tris[(3-methylphenyl)phenylamino]triphenylamine). Alternative hole-injecting materials reportedly useful in organic EL devices are described in EP 0 891 121 A1 and EP 1 029 909 A1. A hole-injection layer is conveniently used in the present invention, and is desirably a plasma-deposited fluorocarbon polymer. The thickness of a hole-injection layer containing a plasma-deposited fluorocarbon polymer can be in the range of 0.2 nm to 15 nm and suitably in the range of 0.3 to 1.5 nm.

Hole-Transporting Layer (HTL)

While not always necessary, it is often useful to include a hole-transporting layer in an OLED device. The hole-transporting layer 107 of the organic EL device contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable tri-arylamines substituted with one or more vinyl radicals and/or comprising at least one active hydrogen containing group are disclosed by Brantley et al U.S. Pat. No. 3,567,450 and 3,658,520.

A more preferred class of aromatic tertiary amines is those which include at least two aromatic tertiary amine moieties as described in U.S. Pat. No. 4,720,432 and 5,061,569. Such compounds include those represented by structural formula (A).

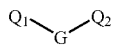

A wherein $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural formula (A) and containing two triarylamine moieties is represented by structural formula (B):

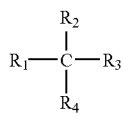

B where
  $R_1$ and $R_2$ each independently represents a hydrogen atom, an aryl group, or an alkyl group or $R_1$ and $R_2$ together represent the atoms completing a cycloalkyl group; and
  $R_3$ and $R_4$ each independently represents an aryl group, which is in turn substituted with a diaryl substituted amino group, as indicated by structural formula (C):

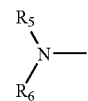

C wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines is the tetraaryldiamines. Desirable tetraaryldiamines include two diarylamino groups, such as indicated by formula (C), linked through an arylene group. Useful tetraaryldiamines include those represented by formula (D).

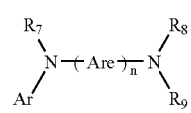

D wherein
  each Are is an independently selected arylene group, such as a phenylene or anthracene moiety,
  n is an integer of from 1 to 4, and
  Ar, $R_7$, $R_8$, and $R_9$ are independently selected aryl groups.
  In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural formulae (A), (B), (C), (D), can each in turn be substituted. Typical substituents include alkyl groups, alkoxy groups, aryl groups, aryloxy groups, and halide such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are usually phenyl and phenylene moieties.

The hole-transporting layer can be formed of a single tertiary amine compound or a mixture of such compounds. Specifically, one may employ a triarylamine, such as a triarylamine satisfying the formula (B), in combination with a tetraayldiamine, such as indicated by formula (D). Illustrative of useful aromatic tertiary amines are the following:

1,1-Bis(4-di-p-tolylaminophenyl)cyclohexane (TAPC)
  1,1-Bis(4-di-p-tolylaminophenyl)-4-methylcyclohexane
  1,1-Bis(4-di-p-tolylaminophenyl)-4-phenylcyclohexane
  1,1-Bis(4-di-p-tolylaminophenyl)-3-phenylpropane (TAPPP)
  N,N,N',N'-tetraphenyl-4,4'''-diamino-1,1':4', 1":4", 1'''-quaterphenyl
  Bis(4-dimethylamino-2-methylphenyl)phenylmethane
  1,4-bis[2-[4-[N,N-di(p-toly)amino]phenyl]vinyl]benzene (BDTAPVB)
  N,N,N',N'-Tetra-p-tolyl-4,4'-diaminobiphenyl (TTB)
  N,N,N',N'-Tetraphenyl-4,4'-diaminobiphenyl
  N,N,N',N'-tetra-1-naphthyl-4,4'-diaminobiphenyl
  N,N,N',N'-tetra-2-naphthyl-4,4'-diaminobiphenyl
  N-Phenylcarbazole
  4,4'-Bis[N-(1-naphthyl)-N-phenylamino]biphenyl (NPB)
  4,4'-Bis[N-(1-naphthyl)-N-(2-naphthyl)amino]biphenyl (TNB)

4,4'-Bis[N-(1-naphthyl)-N-phenylamino]$_p$-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4'-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis {N-phenyl-N-[4-(1-naphthyl)-phenyl]amino}biphenyl
2,6-Bis[N,N-di(2-naphthyl)amino]fluorene
4,4',4"-tris[(3-methylphenyl)phenylamino]triphenylamine (MTDATA)
4,4'-Bis[N-(3-methylphenyl)-N-phenylamino]biphenyl (TPD)

Another class of useful hole-transporting materials includes polycyclic aromatic compounds as described in EP 1 009 041. Tertiary aromatic amines with more than two amine groups may be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS. It is also possible for the hole-transporting layer to comprise two or more sublayers of differing compositions, the composition of each sublayer being as described above. The thickness of the hole-transporting layer can be between 10 and about 500 nm and suitably between 50 and 300 nm.

Light-Emitting Layer (LEL)

In one embodiment, the composite of the invention is included in the LEL of an EL device. The pure facial form of an aluminum trisquinoline complex may emit blue or blue-green light in the LEL. Suitably the complex may comprise a host material, which may be used in combination with light-emitting material. Light emitting materials useful in the EL device include fluorescent materials. As more fully described in U.S. Pat. Nos. 4,769,292 and 5,935,721, the light-emitting layer (LEL) of the organic EL element includes a luminescent material where electroluminescence is produced as a result of electron-hole pair recombination. The light-emitting layer can be comprised of a single material, but more commonly consists of a host material doped with a guest emitting material or materials where light emission comes primarily from the emitting materials and can be of any color.

The pure facial form of an aluminum trisquinoline complex may be used in combination with another host material. The host materials in the light-emitting layer can be an electron-transporting material, as defined below, a hole-transporting material, as defined above, or another material or combination of materials that support hole-electron recombination. Fluorescent emitting materials are typically incorporated at 0.01 to 10% by weight of the host material.

The host and emitting materials can be small non-polymeric molecules or polymeric materials such as polyfluorenes and polyvinylarylenes (e.g., poly(p-phenylenevinylene), PPV). In the case of polymers, small-molecule emitting materials can be molecularly dispersed into a polymeric host, or the emitting materials can be added by copolymerizing a minor constituent into a host polymer. Host materials may be mixed together in order to improve film formation, electrical properties, light emission efficiency, operating lifetime, or manufacturability. The host may comprise a material that has good hole-transporting properties and a material that has good electron-transporting properties.

An important relationship for choosing a fluorescent material as a guest emitting material is a comparison of the excited singlet-state energies of the host and the fluorescent material. It is highly desirable that the excited singlet-state energy of the fluorescent material be lower than that of the host material. The excited singlet-state energy is defined as the difference in energy between the emitting singlet state and the ground state. For non-emissive hosts, the lowest excited state of the same electronic spin as the ground state is considered the emitting state.

Host and emitting materials known to be of use include, but are not limited to, those disclosed in U.S. Pat. Nos. 4,768,292, 5,141,671, 5,150,006, 5,151,629, 5,405,709, 5,484,922, 5,593,788, 5,645,948, 5,683,823, 5,755,999, 5,928,802, 5,935,720, 5,935,721, and 6,020,078.

It may be desirable to use the composite of the invention with other metal complexes of 8-hydroxyquinoline and similar derivatives, also known as metal-chelated oxinoid compounds (Formula E), which constitute one class of useful host compounds capable of supporting electroluminescence. Some of these materials are particularly suitable for light emission of wavelengths longer than 500 nm, e.g., green, yellow, orange, and red.

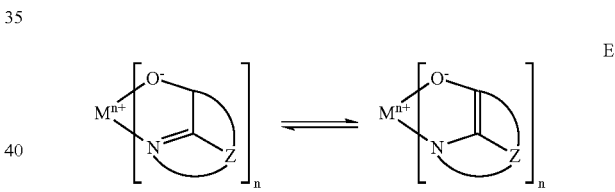

E wherein

M represents a metal;

n is an integer of from 1 to 4; and

Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; a trivalent metal, such aluminum or gallium, or another metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato) aluminum(III)]

CO-2: Magnesium bisoxine [alias, bis(8-quinolinolato) magnesium(II)]

CO-3: Bis[benzo{f}-8-quinolinolato]zinc (II)

CO-4: Bis(2-methyl-8-quinolinolato)aluminum(III)-1μ-oxo-bis(2-methyl-8-quinolinolato) aluminum(III)

CO-5: Indium trisoxine [alias, tris(8-quinolinolato)indium]

CO-6: Aluminum tris(5-methyloxine) [alias, tris(5-methyl-8-quinolinolato) aluminum(III)]

CO-7: Lithium oxine [alias, (8-quinolinolato)lithium(I)]

CO-8: Gallium oxine [alias, tris(8-quinolinolato)gallium (III)]

CO-9: Zirconium oxine [alias, tetra(8-quinolinolato)zirconium(IV)]

Derivatives of 9,10-di-(2-naphthyl)anthracene (Formula F) constitute one class of useful host materials capable of supporting electroluminescence, and are particularly suitable for light emission of wavelengths longer than 400 nm, e.g., blue, green, yellow, orange or red.

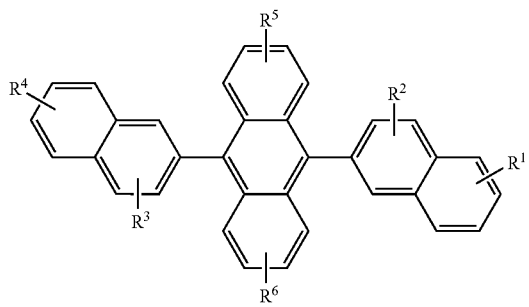

F wherein: $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl; pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxyl amino, alkylamino, or arylamino of from 1 to 24 carbon atoms; and Group 6: fluorine, chlorine, bromine or cyano.

Illustrative examples include 9,10-di-(2-naphthyl)anthracene and 2-t-butyl-9,10-di-(2-naphthyl)anthracene. Other anthracene derivatives can be useful as a host in the LEL, including derivatives of 9,10-bis[4-(2,2-diphenylethenyl)phenyl]anthracene.

Benzazole derivatives (Formula G) constitute another class of useful host materials capable of supporting electroluminescence, and are particularly suitable for light emission of wavelengths longer than 400 nm, e.g., blue, green, yellow, orange or red.

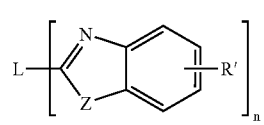

G wherein:

n is an integer of 3 to 8;

Z is O, NR or S; and

R and R' are individually hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and L is a linkage unit consisting of alkyl, aryl, substituted alkyl, or substituted aryl, which connects the multiple benzazoles together. L may be either conjugated with the multiple benzazoles or not in conjugation with them. An example of a useful benzazole is 2,2',2"-(1,3,5-phenylene)tris[1-phenyl-1H-benzimidazole].

Styrylarylene derivatives as described in U.S. Pat. No. 5,121,029 and JP 08333569 are also useful hosts for blue emission. For example, 9,10-bis[4-(2,2-diphenylethenyl) phenyl]anthracene and 4,4'-bis(2,2-diphenylethenyl)-1,1'-biphenyl (DPVBi) are useful hosts for blue emission.

Useful fluorescent emitting materials include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrylium and thiapyrylium compounds, fluorene derivatives, periflanthene derivatives, indenoperylene derivatives, bis(azinyl)amine boron compounds, bis(azinyl)methane compounds, and carbostyryl compounds. Illustrative examples of useful materials include, but are not limited to, the following:

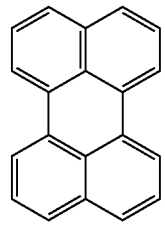

L1

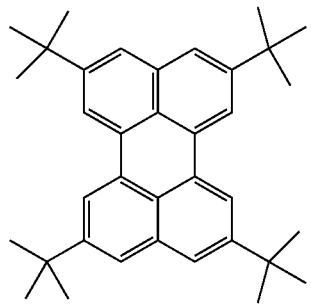

L2

-continued
L3
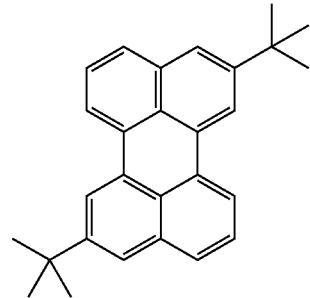
L4
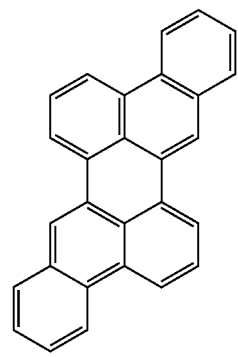
L5
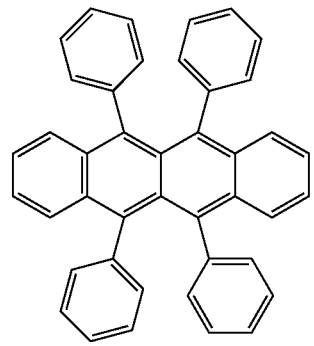
L6
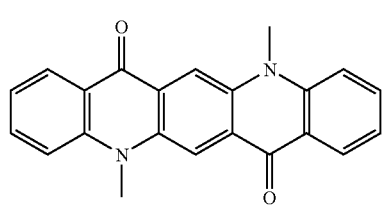
L7
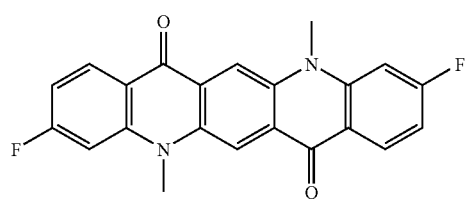
-continued
L8
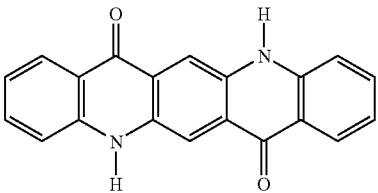
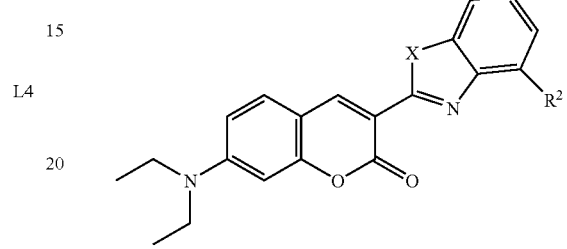
| | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |
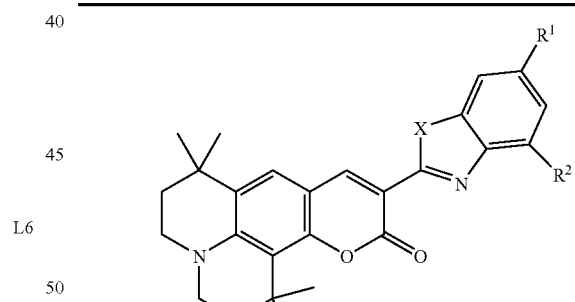
| | X | R1 | R2 |
|---|---|---|---|
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |

-continued
| | | | |
|---|---|---|---|
| L35 | S | t-butyl | H |
| L36 | S | t-butyl | t-butyl |
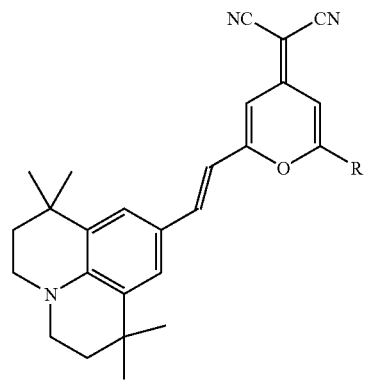
| | R |
|---|---|
| L37 | phenyl |
| L38 | methyl |
| L39 | t-butyl |
| L40 | mesityl |
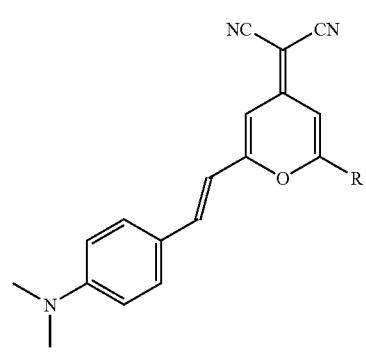
| | R |
|---|---|
| L41 | phenyl |
| L42 | methyl |
| L43 | t-butyl |
| L44 | mesityl |
L45
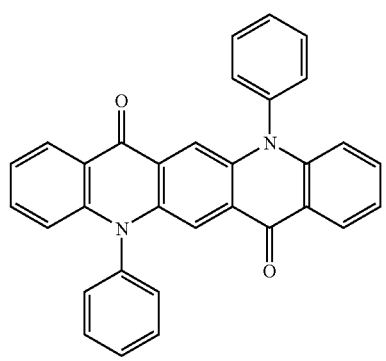
-continued
L46
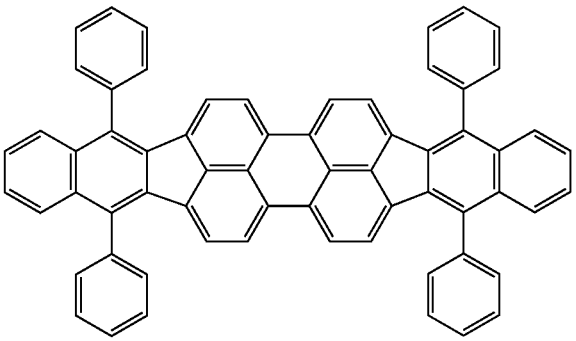
L47
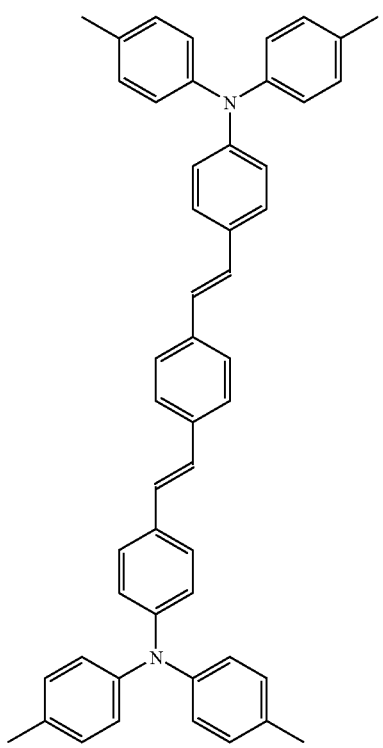

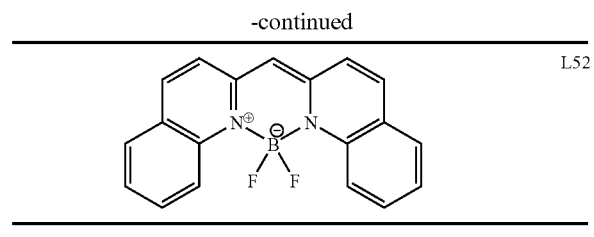

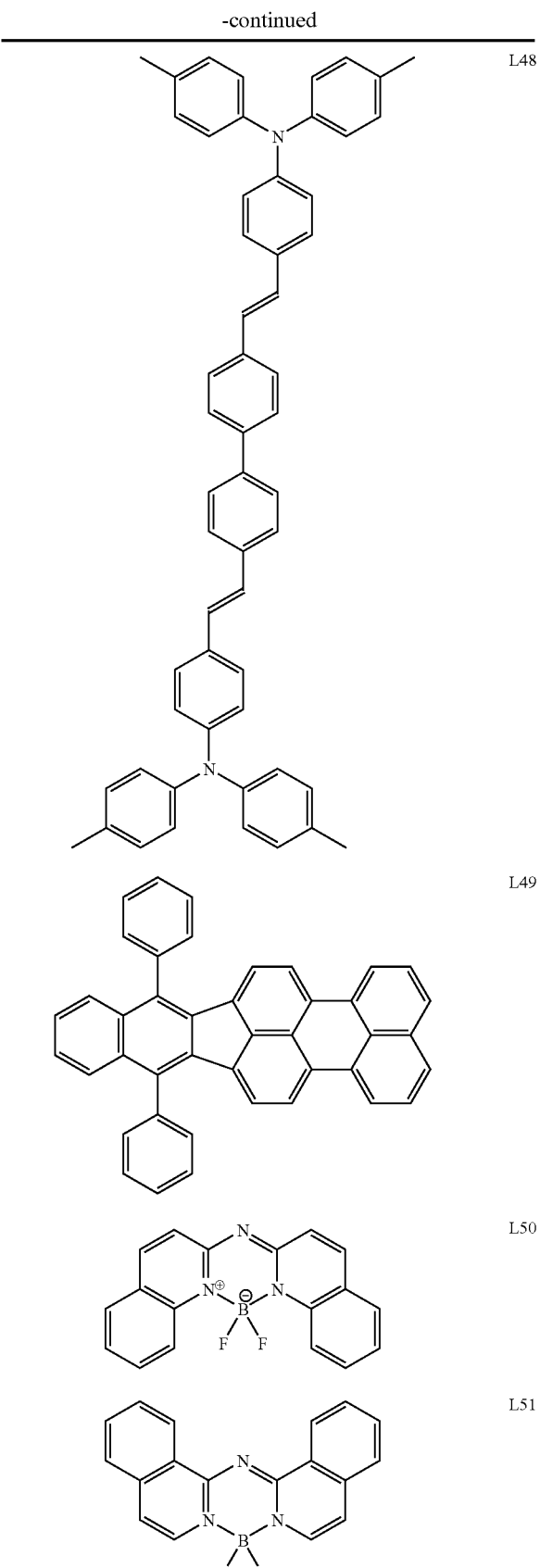

In addition to fluorescent light-emitting materials, light-emitting phosphorescent materials may be used in the EL device. For convenience, the phosphorescent complex guest material may be referred to herein as a phosphorescent material. The phosphorescent material typically includes one or more ligands, for example monoanionic ligands that can be coordinated to a metal through an sp$^2$ carbon and a heteroatom. Conveniently, the ligand can be phenylpyridine (ppy) or derivatives or analogs thereof. Examples of some useful phosphorescent organometallic materials include tris (2-phenylpyridinato-N,C$^{2'}$)iridium(III), bis(2-phenylpyridinato-N,C$^{2'}$)iridium(II)(acetylacetonate), and bis(2-phenylpyridinato-N,C$^{2'}$)platinum(II). Usefully, many phosphorescent organometallic materials emit in the green region of the spectrum, that is, with a maximum emission in the range of 510 to 570 nm.

Phosphorescent materials may be used singly or in combinations other phosphorescent materials, either in the same or different layers. Phosphorescent materials and suitable hosts are described in WO 00/57676, WO 00/70655, WO 01/41512 A1, WO 02/15645 A1, US 2003/0017361 A1, WO 01/93642 A1, WO 01/39234 A2, U.S. Pat. No. 6,458,475 B1, WO 02/071813 A1, U.S. Pat. No. 6,573,651 B2, US 2002/0197511 A1, WO 02/074015 A2, U.S. Pat. No. 6,451, 455 B1, US 2003/0072964 A1, 2003/0068528 A1, U.S. Pat. Nos. 6,413,656 B1, 6,515,298 B2, 6,451,415 B1, 6,097,147, US 2003/0124381 A1, US 2003/0059646 A 1, US 2003/0054198 A1, EP 1 239 526 A2, EP 1 238 981 A2, EP 1 244 155 A2, US 2002/0100906 A1, US 2003/0068526 A1, US 2003/0068535 A1, JP 2003073387A, JP 2003 073388A, US 2003/0141809 A1, US 2003/0040627 A1, JP 2003059667A, JP 2003073665A, and US 2002/0121638 A1.

The emission wavelengths of cyclometallated Ir(III) complexes of the type IrL$_3$ and IrL$_2$L', such as the green-emitting fac-tris(2-phenylpyridinato-N, C$^{2'}$)iridium(III) and bis(2-phenylpyridinato-N,C$^{2'}$)iridium(III)(acetylacetonate) may be shifted by substitution of electron donating or withdrawing groups at appropriate positions on the cyclometallating ligand L, or by choice of different heterocycles for the cyclometallating ligand L. The emission wavelengths may also be shifted by choice of the ancillary ligand L'. Examples of red emitters are the bis(2-(2'-benzothienyl)pyridinato-N, C$^{3'}$)iridium(III)(acetylacetonate) and tris(2-phenylisoquinolinato-N,C$^{2'}$)iridium(III). A blue-emitting example is bis(2-(4,6-difluorophenyl)-pyridinato-N,C$^{2'}$)iridium(III) (picolinate).

Red electrophosphorescence has been reported, using bis(2-(2'-benzo[4,5-a]thienyl)pyridinato-N,C$^3$) iridium (acetylacetonate) [Btp$_2$Ir(acac)] as the phosphorescent material (C. Adachi, S. Lamansky, M. A. Baldo, R. C. Kwong, M. E. Thompson, and S. R. Forrest, *App. Phys. Lett.*, 78, 1622–1624 (2001)).

Other important phosphorescent materials include cyclometallated Pt(II) complexes such as cis-bis(2-phenylpyridinato-N,C$^{2'}$)platinum(II), cis-bis(2-(2'-thienyl)pyridinato-N, C$^{3'}$) platinum(II), cis-bis(2-(2'-thienyl)quinolinato-N,C$^{5'}$)

platinum(II), or (2-(4,6-difluorophenyl)pyridinato-N,C$^{2'}$) platinum (II) (acetylacetonate). Pt (II) porphyrin complexes such as 2,3,7,8,12,13,17,18-octaethyl-21H, 23H-porphine platinum(II) are also useful phosphorescent materials.

Still other examples of useful phosphorescent materials include coordination complexes of the trivalent lanthanides such as Tb$^{3+}$ and Eu$^{3+}$ (J. Kido et al., *Appl. Phys. Lett.*, 65, 2124 (1994)).

Suitable host materials for phosphorescent materials should be selected so that transfer of a triplet exciton can occur efficiently from the host material to the phosphorescent material but cannot occur efficiently from the phosphorescent material to the host material. Therefore, it is highly desirable that the triplet energy of the phosphorescent material be lower than the triplet energy of the host. Generally speaking, a large triplet energy implies a large optical bandgap. However, the band gap of the host should not be chosen so large as to cause an unacceptable barrier to injection of charge carriers into the light-emitting layer and an unacceptable increase in the drive voltage of the OLED. Suitable host materials are described in WO 00/70655 A2; 01/39234 A2; 01/93642 A1; 02/074015 A2; 02/15645 A1, and U.S. Pat No. 20020117662. Suitable hosts include certain aryl amines, triazoles, indoles and carbazole compounds. Examples of desirable hosts are 4,4'-N,N'-dicarbazole-biphenyl, otherwise known as 4,4'-bis(carbazol-9-yl)biphenyl or CBP; 4,4'-N,N'-dicarbazole-2,2'-dimethyl-biphenyl, otherwise known as 2,2'-dimethyl-4,4'-bis(carbazol-9-yl)biphenyl or CDBP; 1,3-bis(N,N'-dicarbazole)benzene, otherwise known as 1,3-bis(carbazol-9-yl)benzene, and poly(N-vinylcarbazole), including their derivatives.

Desirable host materials are capable of forming a continuous film.

Hole-Blocking Layer (HBL)

In addition to suitable hosts, an OLED device employing a phosphorescent material often requires at least one hole-blocking layer placed between the electron-transporting layer 111 and the light-emitting layer 109 to help confine the excitons and recombination events to the light-emitting layer comprising the host and phosphorescent material. In this case, there should be an energy barrier for hole migration from the host into the hole-blocking layer, while electrons should pass readily from the hole-blocking layer into the light-emitting layer comprising a host and a phosphorescent material. The first requirement entails that the ionization potential of the hole-blocking layer be larger than that of the light-emitting layer 109, desirably by 0.2 eV or more. The second requirement entails that the electron affinity of the hole-blocking layer not greatly exceed that of the light-emitting layer 109, and desirably be either less than that of light-emitting layer or not exceed that of the light-emitting layer by more than about 0.2 eV.

When used with an electron-transporting layer whose characteristic luminescence is green, such as an Alq-containing electron-transporting layer as described below, the requirements concerning the energies of the highest occupied molecular orbital (HOMO) and lowest unoccupied molecular orbital (LUMO) of the material of the hole-blocking layer frequently result in a characteristic luminescence of the hole-blocking layer at shorter wavelengths than that of the electron-transporting layer, such as blue, violet, or ultraviolet luminescence. Thus, it is desirable that the characteristic luminescence of the material of a hole-blocking layer be blue, violet, or ultraviolet. It is further desirable, but not absolutely required, that the triplet energy of the hole-blocking material be greater than that of the phosphorescent material. Suitable hole-blocking materials are described in WO 00/70655A2 and WO 01/93642 A1. Two examples of useful hole-blocking materials are bathocuproine (BCP) and bis(2-methyl-8-quinolinolato)(4-phenylphenolato)aluminum(III) (BAlq). The characteristic luminescence of BCP is in the ultraviolet, and that of BAlq is blue. Metal complexes other than BAlq are also known to block holes and excitons as described in U.S. Pat No. 20030068528. In addition, U.S. Pat No. 20030175553 A1 describes the use of fac-tris(1-phenylpyrazolato-N,C$^{2'}$)iridium(III) (Irppz) for this purpose.

When a hole-blocking layer is used, its thickness can be between 2 and 100 nm and suitably between 5 and 10 nm.

Electron-Transporting Layer (ETL)

Desirable thin film-forming materials for use in forming the electron-transporting layer 111 of the organic EL devices of this invention are metal-chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary of contemplated oxinoid compounds are those satisfying structural formula (E), previously described.

Other electron-transporting materials suitable for use in the electron-transporting layer 111 include various butadiene derivatives as disclosed in U.S. Pat. No. 4,356,429 and various heterocyclic optical brighteners as described in U.S. Pat. No. 4,539,507. Benzazoles satisfying structural formula (G) are also useful electron transporting materials. Triazines are also known to be useful as electron transporting materials.

If both a hole-blocking layer and an electron-transporting layer 111 are used, electrons should pass readily from the electron-transporting layer 111 into the hole-blocking layer. Therefore, the electron affinity of the electron-transporting layer 111 should not greatly exceed that of the hole-blocking layer. Desirably, the electron affinity of the electron-transporting layer should be less than that of the hole-blocking layer or not exceed it by more than about 0.2 eV.

If an electron-transporting layer is used, its thickness may be between 2 and 100 nm and suitably between 5 and 20 nm.

Other Useful Organic Layers and Device Architecture

In some instances, layers 109 through 111 can optionally be collapsed into a single layer that serves the function of supporting both light emission and electron transportation. The hole-blocking layer, when present, and layer 111 may also be collapsed into a single layer that functions to block holes or excitons, and supports electron transport. It also known in the art that emitting materials may be included in the hole-transporting layer 107. In that case, the hole-transporting material may serve as a host. Multiple materials may be added to one or more layers in order to create a white-emitting OLED, for example, by combining blue- and yellow-emitting materials, cyan- and red-emitting materials, or red-, green-, and blue-emitting materials. White-emitting devices are described, for example, in EP 1 187 235, US 20020025419, EP 1 182 244, U.S. Pat. Nos. 5,683,823, 5,503,910, 5,405,709, and 5,283,182 and can be equipped with a suitable filter arrangement to produce a color emission.

This invention may be used in so-called stacked device architecture, for example, as taught in U.S. Pat. Nos. 5,703,436 and 6,337,492.

Deposition of Organic Layers

The organic materials mentioned above are suitably deposited by any means suitable for the form of the organic materials. In the case of small molecules, they are conveniently deposited through sublimation or evaporation, but can be deposited by other means such as coating from a solvent together with an optional binder to improve film formation. If the material is a polymer, solvent deposition is usually preferred. The material to be deposited by sublimation or evaporation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,688,551, 5,851,709 and 6,066,357) or an inkjet method (U.S. Pat. No. 6,066,357).

Encapsulation

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as $SiO_x$, Teflon, and alternating inorganic/polymeric layers are known in the art for encapsulation. Any of these methods of sealing or encapsulation and desiccation can be used with the EL devices constructed according to the present invention.

Optical Optimization

OLED devices of this invention can employ various well-known optical effects in order to enhance their emissive properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color-conversion filters over the display. Filters, polarizers, and anti-glare or anti-reflection coatings may be specifically provided over the EL device or as part of the EL device.

Embodiments of the invention, when included in an EL device, may provide advantageous features such as higher luminous yield, lower drive voltage, higher power efficiency, improved stability, ease of manufacture, and reduced sublimation temperatures as well as desirable hues including those useful in the emission of white light (directly or through filters to provide multicolor displays). Embodiments of the invention may also provide devices incorporating the EL device such as electronic displays and an area lighting devices.

The invention and its advantages can be better appreciated by the following examples.

A series of $Alq_3$ films were prepared for thermal processing. The aim of the thermal processing was to generate, upon UV light excitation, blue emitting $Alq_3$ films while maintaining the physical integrity of the deposited $Alq_3$ films.

Films were deposited onto 63.5 mm×63.5 mm (2.5 in by 2.5 in) square quartz glass (General Electric) or glass (Corning) substrates, both hereafter referred to as substrate. The $Alq_3$ films were prepared by sublimation of commercially available $Alq_3$ (EastmanKodak Company) onto a substrate by heating an $Alq_3$ target. The $Alq_3$ film thickness was 100 nm. The $Alq_3$ film was deposited using a circular mask resulting in each deposited $\alpha$-$Alq_3$ film having a diameter of 17 mm. The film must maintain dimensional stability if it is to useable in a single or multi stage deposition organic light emitting diode device.

Some of the $Alq_3$ films had a 29 mm diameter metal overcoat, deposited by sputter deposition, on top of the $Alq_3$ and substrate. The metal was either aluminum (Al), or silver (Ag). The metal thickness for Al was 1 micron and for Ag was 100 nm. Some of the $Alq_3$ films had a piece of cover glass, 63.5 mm×63.5 mm (2.5 in by 2.5 in) square, placed over the $Alq_3$ film and substrate. The term sample will be used to describe a substrate/$Alq_3$, substrate/$Alq_3$/cover glass, or substrate/$Alq_3$/metal overcoat layered structures.

Thermal processing, or annealing, of samples was performed using a Deltech furnace. The furnace was preheated to a specified temperature before placing the sample in the furnace. After annealing for a specified time, the sample was removed from the furnace and cooled at 20–22° C. in ambient air, hereafter referred to as air cool.

Qualitative visible light color emission for each sample was observed using a VWR UV light source providing a UV excitation wavelength of 365 nanometers (nm).

For each sample, the visible light emission wavelength due to ultraviolet (UV) light excitation was measured in a quantitative manner using an emission spectrometer comprised of a xenon (Xe) arc lamp, monochromator, and diode array emission spectrometer. The reported excitation wavelength was the result of a 390 nm wavelength excitation. For a more complete analysis some samples were observed to have the same emission wavelength for the respective samples over a range of excitation wavelengths, 350–420 nm, and would be expected to hold constant over a wider range.

EXAMPLE 1: Comparative

An $\alpha$-$Alq_3$ film of 100 nm thickness was deposited on a quartz glass substrate. The $Alq_3$ film diameter was 17 mm. No metal overcoat or cover glass was placed over the film. The sample was analyzed without annealing. The film had a visible light color emission from a 365 nm excitation of yellow-green colored light. Emission from a 390 nm excitation had a maximum at 536 nm. As expected, the facial-$\delta$ isomer of $Alq_3$ has not formed without the thermal annealing process.

EXAMPLE 2: Comparative

An $\alpha$-$Alq_3$ film of 100 nm thickness and having a diameter of 17 mm was deposited on a glass substrate. An overcoat of aluminum metal of 1 μm thickness was then deposited over the $Alq_3$ film. The sample was analyzed without annealing. The film had a visible light color emission from a 365 nm excitation of yellow-green colored light. Emission from a 390 nm excitation had a maximum at 534 nm. As expected, the facial-$\delta$ isomer of $Alq_3$ has not formed without the thermal annealing process. The presence of a metal overcoat did not significantly affect the emission characteristics of the $Alq_3$ film.

EXAMPLE 3: Comparative

An α-Alq$_3$ film thickness of 100 nm was deposited on a quartz glass substrate. The Alq$_3$ film diameter was 17 mm. A metal overcoat of silver metal of 100 nm thickness was then deposited over the Alq$_3$ film. The sample was analyzed without annealing. The film had a visible light color emission from a 365 nm excitation of yellow-green colored light. Emission from a 390 nm excitation had a maximum at 535 nm. As expected, the facial-δ isomer of Alq$_3$ has not formed without the thermal annealing process. The presence of a silver metal overcoat did not significantly affect the emission characteristics of the Alq$_3$ film.

EXAMPLE 4: Comparative

An α-Alq$_3$ film of 100 nm thickness and having a diameter of 17 mm was deposited on a glass substrate. A 1 mm thick cover glass was placed over the deposited Alq$_3$ film. The sample was analyzed without annealing. The film had a visible light color emission from a 365 nm excitation of yellow-green colored light. Emission from a 390 nm excitation had a maximum at 536 nm. As expected, the facial-δ isomer of Alq$_3$ has not formed without the thermal annealing process. The presence of a glass did not significantly affect the emission characteristics of the Alq$_3$ film.

EXAMPLE 5: Comparative

An α-Alq$_3$ film of 100 nm thickness and having a diameter of 17 mm was deposited on a quartz glass substrate. An overcoat of silver metal of 100 nm thickness was then deposited over the Alq$_3$ film. The sample was heated at 420° C. for 5 min and then allowed to cool. After this annealing the Alq$_3$ film diameter was measured as 17 mm. The film had a no visible light color emission from a 365 nm excitation or from a 390 nm excitation.

The diameter of the Alq$_3$ film in comparative Example 5 remains at 17 mm after a single step annealing, indicating that an Alq$_3$ film deposited with a metal overcoat using the method described in this invention will maintain film integrity. However, when heating above the melting point of Alq$_3$ (417° C.) the emission properties of Alq$_3$ are degraded. Comparative Example 5 does not demonstrate any visible emission upon UV excitation. Though the film maintained dimensional stability, the loss of emission properties makes comparative Example 5 unusable in an organic light emitting diode application.

EXAMPLE 6: Comparative

An α-Alq$_3$ film of 100 nm thickness and having a diameter of 17 mm was deposited on a quartz glass substrate. The sample was then subjected to heat processing without an overcoat. The sample was heated at 365° C. for 5 min and then allowed to cool. After this annealing cycle the Alq$_3$ film diameter was 8 mm. The film had a visible light color emission from a 365 nm excitation of blue colored light.

The diameter of the Alq$_3$ film in Comparative Example 6 was measured to be 8 mm indicating that an Alq$_3$ film deposited without an overcoat did not maintain film integrity. Some of the Alq$_3$ has likely sublimed away in comparative Example 6 as a result of annealing. Thus the Alq$_3$ film without a deposited metal overcoat will not maintain film thermal stability during thermal processing. The Alq$_3$ film does show blue emission due to thermal processing, however, when heating without the metal overcoat the absence of dimensional stability renders comparative Example 6 unusable in an organic light emitting diode application.

EXAMPLE 7: Comparative

An α-Alq$_3$ film of 100 nm thickness and having a diameter of 17 mm was deposited on a quartz glass substrate. A 1 mm thick cover glass was placed over the Alq$_3$ film. The sample was heated at 365° C. for 5 min and then allowed to cool. After this annealing the Alq$_3$ film diameter was 12 mm. The film had a visible light color emission from a 365 nm excitation of blue colored light.

The change in diameter of the Alq$_3$ film in comparative Example 7 indicates that an Alq$_3$ film with a cover glass will not maintain film dimensional stability during thermal processing. It is likely that some of the Alq$_3$ has sublimed away. The Alq$_3$ film does show blue emission after thermal processing, however, the absence of dimensional stability renders comparative Example 7 unusable in an organic light emitting diode application.

EXAMPLE 8: Comparative

The process described in Inventive Comparative Example 7 was repeated except the thermal annealing process consisted of heating the film at 390° C. for 5 min and then allowing the material to air cool. After this annealing cycle the Alq$_3$ film diameter was measured as 8 mm. The film had a visible light color emission from a 365 nm excitation of blue colored light.

As in the case of Comparative Example 7, the change in diameter of the Alq$_3$ film in Comparative Example 8 indicates that an Alq$_3$ film with a cover glass will not maintain film dimensional stability during thermal processing. The Alq$_3$ film does show blue emission after thermal processing, however, the absence of dimensional stability renders Comparative Example 8 unusable in an organic light emitting diode application.

EXAMPLE 9: Inventive

An α-Alq$_3$ film of 100 nm thickness and having a diameter of 17 mm was deposited on a quartz glass substrate. A metal overcoat of aluminum metal of 1 μm thickness was then deposited over the Alq$_3$ film. The sample was heated at 300° C. for 5 min, allowed to air cool, heated again at 300° C. for 5 min, allowed to cool, heated at 315° C. for 5 min, allowed to cool, and finally heated at 365° C. for 5 min and allowed to cool. After this annealing cycle the Alq$_3$ film diameter was 17 mm. The film had a visible light color emission from a 365 nm excitation of blue colored light. Emission from a 390 nm excitation had a maximum at 490 nm.

The diameter of the Alq$_3$ film in Example 9 remains at 17 mm after a multi-step annealing process, indicating that an Alq$_3$ film deposited with a metal overcoat using the method described in this invention will maintain film integrity. The film demonstrates blue emission upon UV excitation. This indicates that the Alq$_3$ has been converted to the pure facial isomer (δ) by the thermal annealing process. By combining the dimensional stability and blue emission as described in Example 9, a novel process for generation of a thin film of blue emitting Alq$_3$ is demonstrated. Such a film could be used in an organic light emitting diode application.

EXAMPLE 10: Inventive

An α-Alq$_3$ film of 100 nm thickness and having a diameter of 17 mm was deposited on a quartz glass substrate. A metal overcoat of aluminum metal of 1 um thickness was then deposited over the Alq$_3$ film. The sample was heated at 325° C. for 5 min, allowed to air cool, heated again at 325° C. for 10 min, allowed to cool, and finally heated at 325° C. for 30 min and allowed to cool. After this annealing cycle the Alq$_3$ film diameter was determined to be 17 mm. The film had a visible light color emission from a 365 nm excitation of blue colored light. Emission from a 390 nm excitation had a maximum at 502 nm.

The diameter of the Alq$_3$ film in Example 10 remains at 17 mm after a multi-step annealing process, indicating that an Alq$_3$ film deposited with a metal overcoat using the method described in this invention will maintain film integrity. The film demonstrated blue emission upon UV excitation. This indicates that the Alq$_3$ has been converted to the pure facial isomer (δ) by the thermal annealing process. By combining the dimensional stability and blue emission as described in Example 10, a novel process for generation of a thin film of blue emitting Alq$_3$ is demonstrated. Such a film could be used in an organic light emitting diode application.

EXAMPLE 11: Inventive

The process described in Inventive Example 10 was repeated except the thermal annealing process consisted of heating the film at 365° C. for 5 min and then allowing the material to air cool. After this annealing cycle the Alq$_3$ film diameter was measured as 17 mm. The film had a visible light color emission from a 365 nm excitation of blue colored light. Emission from a 390 nm excitation had a maximum at 490 nm. The diameter of the Alq$_3$ film remained at 17 mm after the annealing, indicating that an Alq$_3$ film deposited with a metal overcoat using the method described in this invention will maintain film integrity. Inventive example 11 demonstrates a process for forming a uniform thin film of facial-δ Alq$_3$ that emits blue light.

EXAMPLE 12: Inventive

The process described in Inventive Example 10 was repeated except the thermal annealing process consisted of heating the film at 365° C. for 10 min and then allowing the material to air cool. After this annealing the Alq$_3$ film diameter was measured as 17 mm. The film had a visible light color emission from a 365 nm excitation of blue colored light. Emission from a 390 nm excitation had a maximum at 492 nm.

The diameter of the Alq$_3$ film remains at 17 mm after an annealing, indicating that an Alq$_3$ film deposited with a metal overcoat using the method described in this invention will maintain film integrity. The film demonstrates blue emission upon UV excitation. This indicates that the Alq$_3$ has been converted to the facial-δ isomer by the thermal annealing process. By combining the dimensional stability and blue emission as described in Example 12, a novel process for generation of a thin film of blue emitting Alq$_3$ is demonstrated. Such a composite could be used in an organic light emitting diode application.

EXAMPLE 13: Inventive

An α-Alq$_3$ film thickness of 100 nm was deposited on a quartz glass substrate. The Alq$_3$ film diameter was 17 mm. A metal overcoat of silver metal of 1 μm thickness was then deposited over the Alq$_3$ film. The sample was heated at 365° C. for 5 min, allowed to air cool, heated again at 300° C. for 5 min, allowed to cool, heated at 315° C. for 5 min and allowed to cool. After this annealing cycle, the Alq$_3$ film diameter was determined to be 17 mm. The film had a visible light color emission from a 365 nm excitation of blue colored light. Emission from a 390 nm excitation had a maximum at 502 nm.

The diameter of the Alq$_3$ film remained at 17 mm after a multi-step annealing, indicating that an Alq$_3$ film deposited with a metal overcoat using the method described in this invention will maintain film integrity. The film demonstrated blue emission upon UV excitation. This indicates that the Alq$_3$ has been converted to the facial-δ isomer by the thermal annealing process.

EXAMPLE 14: Inventive

The process described in Inventive Example 13 was repeated except the thermal annealing process consisted of heating the film at 365° C. for 10 min and then allowing the material to air cool. After this annealing, the Alq$_3$ film diameter remained at 17 mm. The film had a visible light color emission from a 365 nm excitation of blue colored light. Emission from a 390 nm excitation had a maximum at 502 nm. The diameter of the Alq$_3$ film remains at 17 mm after an annealing, indicating that an Alq$_3$ film deposited with a metal overcoat using the method described in this invention will maintain film integrity. Inventive example 14 demonstrates a process for forming a uniform composite containing a thin film of facial-δ Alq$_3$ that emits blue light.

EXAMPLE 15: Inventive

The process described in Inventive Example 13 was repeated except the thermal annealing process consisted of heating the film at 390° C. for 2 min and then allowing the material to air cool. After this annealing cycle the Alq$_3$ film diameter was 17 mm. The film had a visible light color emission from a 365 nm excitation of blue colored light. Emission from a 390 nm excitation had a maximum at 505 μm. The diameter of the Alq$_3$ film remains at 17 mm after an annealing, indicating that an Alq$_3$ film deposited with a metal overcoat using the method described in this invention will maintain film integrity. Inventive Example 15 demonstrates a process for forming a composite including a uniform thin film of facial-δ Alq$_3$ that emits blue light.

EXAMPLE 16: Inventive

The process described in Inventive Example 13 was repeated except the thermal annealing process consisted of heating the film at 390° C. for 10 min and then allowing the material to air cool. After this annealing the Alq$_3$ film diameter was 17 mm. The film had a visible light color emission from a 365 nm excitation of blue colored light. Emission from a 390 nm excitation had a maximum at 505 nm. The diameter of the Alq$_3$ film remains at 17 mm after an annealing, indicating that an Alq$_3$ film deposited with a metal overcoat using the method described in this invention will maintain film integrity. Inventive Example 16 demonstrates a process for forming a composite including a uniform thin film of facial-δ Alq$_3$ that emits blue light.

The results for examples 1-16 are summarized in Table 1. Without thermal processing α-Alq$_3$ films exhibit yellow-green emission when excited with UV light, independent of the presence or absence of a metal overcoat or cover glass (Examples 1-4). Thermal processing of meridional-$Alq_3$ films at too high of a temperature, such as at 420° C., results in decomposition and formation of a material that does not emit (Example 5). Thermal processing of meridional-$Alq_3$ films at lower temperatures, for example between 325 and 390° C. will provide facial-δ $Alq_3$ films that exhibit blue emission when excited with UV light. However, $Alq_3$ films annealed without an overcoat or films annealed with a cover glass will exhibit a reduced film diameter (Examples 6-8). The decrease in diameter is a result of the loss of $Alq_3$ likely due to sublimation of $Alq_3$. $Alq_3$ films annealed with a metal overcoat as described in this invention will maintain dimensional stability while exhibiting blue emission when excited with UV light (Examples 9–16). The overcoat prevents the loss of $Alq_3$. The invention of a blue emitting $Alq_3$ film with dimensional stability is the combination of annealing and the sealing capability of a conforming overcoat.

111 Electron-Transporting Layer (ETL)
113 Cathode

The invention claimed is:

1. A process for forming a film of the facial-isomer of an aluminum trisquinoline complex comprising depositing a film of an aluminum trisquinoline complex on a support, depositing an inert barrier layer over the layer of aluminum trisquinoline complex that encapsulates aluminum trisquinoline complex to form a multilayer composite, and then heating the composite at a temperature below the melting point temperature of the complex for a time sufficient to convert the aluminum trisquinoline complex to at least 99 mol % of the facial-isomer that fluoresces with a maximum emission intensity below 510 nm.

2. A process according to claim 1 wherein the multilayer composite is heated at a temperature not more than 150° C. below the melting point of the complex.

TABLE 1

Summary of Conditions and Results for Examples 1–16

| Example | Type | Overcoat | Annealing Temperature (° C.) | Time (min) | Light Emission | Change - $Alq_3$ Diameter |
|---|---|---|---|---|---|---|
| 1 | Comparative | None | 20–22 | — | Yellow-Green | 0% |
| 2 | Comparative | Al | 20–22 | — | Yellow-Green | 0% |
| 3 | Comparative | Ag | 20–22 | — | Yellow-Green | 0% |
| 4 | Comparative | Glass | 20–22 | — | Yellow-Green | 0% |
| 5 | Comparative | Ag | 420 | 05 | None | 0% |
| 6 | Comparative | None | 365 | 05 | Blue | −53% |
| 7 | Comparative | Glass | 365 | 05 | Blue | −29% |
| 8 | Comparative | Glass | 390 | 05 | Blue | −59% |
| 9 | Inventive | Al | 300 | 05 | Blue | 0% |
|   |   |   | 300 | 05 |   |   |
|   |   |   | 315 | 05 |   |   |
|   |   |   | 365 | 05 |   |   |
| 10 | Inventive | Al | 325 | 05 | Blue | 0% |
|   |   |   | 325 | 10 |   |   |
|   |   |   | 325 | 30 |   |   |
| 11 | Inventive | Al | 365 | 05 | Blue | 0% |
| 12 | Inventive | Al | 365 | 10 | Blue | 0% |
| 13 | Inventive | Ag | 365 | 05 | Blue | 0% |
| 14 | Inventive | Ag | 365 | 10 | Blue | 0% |
| 15 | Inventive | Ag | 390 | 02 | Blue | 0% |
| 16 | Inventive | Ag | 390 | 05 | Blue | 0% |

The entire contents of the patents and other publications referred to in this specification are incorporated herein by reference. The invention has been described in detail with particular reference to certain preferred embodiments thereof, but it will be understood that variations and modifications can be effected within the spirit and scope of the invention.

PARTS LIST

Meridional isomer
Facial isomer
101 Substrate
103 Anode
105 Hole-Injecting Layer (HIL)
107 Hole-Transporting Layer
109 Light-Emitting Layer (LEL)

3. A process according to claim 1 wherein the composite is heated at a temperature at least 50° C. below the melting point temperature of the complex.

4. A process according to claim 1 wherein heating is continued until at least 99 mol % of the facial-isomer is one polymorph.

5. A process according to claim 1 wherein the inert barrier layer comprises an inorganic material.

6. A process according to claim 1 wherein the inert barrier layer comprises a metal.

7. A process according to claim 1 wherein the inert barrier layer comprises aluminum or silver.

8. A process according to claim 1 wherein the inert barrier layer comprises an organic material having a glass transition temperature greater than the heating temperature.

9. A process according to claim 1 wherein the inert barrier layer comprises a hole-transporting material or an electron-transporting material.

10. A process according to claim 1, wherein the barrier layer comprises an anode or a cathode.

11. A process according to claim 1, wherein the support comprises a cathode or an anode.

12. A process according to claim 1, wherein a second material is co-deposited with the aluminum trisquinoline complex in an amount of 0.5 to 10% by volume of the layer.

13. A process according to claim 12, wherein the second material emits light.

14. A process according to claim 1 wherein the aluminum trisquinoline complex comprises tris(2-methyl-8-quinolinolato)aluminum(III).

15. A process according to claim 14 wherein heating is continued until at least 99 mol % of the δ-phase of facial -tris(2-methyl-8-quinolinolato)aluminum(III) is formed.

16. A process according to claim 14 wherein the multilayer is heated at a temperature of 370° C. or lower.

17. A process according to claim 14 wherein the multilayer is heated at a temperature of 360° C. or lower.

18. A process according to claim 14 wherein the multilayer is heated at a temperature below 350° C.

19. A multilayer composite comprising at least three layers wherein the first layer comprises a support layer, the second layer includes an aluminum trisquinoline complex which is at least 99% of the facial-isomer wherein at least 99% of the facial-isomer comprises the δ-phase of facial-tris(2-methyl-8-quinolinolato)aluminum(III). and the third layer comprises a barrier layer, and provided that the barrier layer comprises a metal or an organic material.

20. A composite according to claim 19, wherein the facial-isomer of the aluminum trisquinoline complex fluoresces with a maximum emission intensity below 510 nm.

21. A composite according to claim 19, wherein the barrier layer includes an organic material having a glass transition temperature greater than the heating temperature.

22. A composite according to claim 19, wherein the support layer includes an organic material having a glass transition temperature greater than the heating temperature.

23. A composite according to claim 19 wherein the inert barrier layer includes a hole-transporting material or an electron-transporting material.

24. A composite according to claim 19 wherein the inert barrier layer includes a metal.

25. A composite according to claim 19 wherein the support layer is a hole-transporting material or an electron-transporting material.

26. A composite according to claim 19, wherein the barrier layer comprises an anode or a cathode.

27. A composite according to claim 19, wherein the support comprises a cathode or an anode.

28. A composite according to claim 19, wherein the second layer contains a second material in an amount of 0.5 to 10% by volume of the layer.

29. A composite according to claim 28, wherein the second material emits light.

30. An electroluminescent device comprising the composite of claim 19.

31. An OLED device comprising the composite of claim 19 wherein at least two layers of the device are vacuum deposited.

32. A display comprising the electroluminescent device of claim 30.

33. The process of claim 1 wherein the barrier layer is deposited to form a conforming layer over the aluminum trisquinoline complex.

34. The composite of claim 19 wherein the barrier layer forms a conforming layer over the aluminum trisquinoline complex.

* * * * *